US010917546B2

United States Patent
Nagahama et al.

(10) Patent No.: US 10,917,546 B2
(45) Date of Patent: Feb. 9, 2021

(54) IMAGING DEVICE UTILIZING SENSOR AREA OF PHOTOELECTRIC CONVERSION ELEMENTS CORRESPONDING TO INCIDENT LIGHT PASSED THROUGH OPTICAL ELEMENTS INCLUDING A LAYER OF POLARIZERS OF HORIZONTAL AND VERTICAL DIRECTIONS AND QUARTER WAVE PLATES

(71) Applicant: SONY SEMICONDUCTOR SOLUTIONS CORPORATION, Kanagawa (JP)

(72) Inventors: Yoshihiko Nagahama, Kanagawa (JP); Kunihiko Hikichi, Kanagawa (JP); Atsushi Yamamoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 3 days.

(21) Appl. No.: 16/318,458

(22) PCT Filed: Jun. 6, 2017

(86) PCT No.: PCT/JP2017/021011
§ 371 (c)(1),
(2) Date: Jan. 17, 2019

(87) PCT Pub. No.: WO2018/020846
PCT Pub. Date: Feb. 1, 2018

(65) Prior Publication Data
US 2019/0297234 A1    Sep. 26, 2019

(30) Foreign Application Priority Data
Jul. 29, 2016    (JP) .................................. 2016-150039

(51) Int. Cl.
*H04N 5/225*    (2006.01)
*H04N 5/369*    (2011.01)
(Continued)

(52) U.S. Cl.
CPC ............. *H04N 5/2254* (2013.01); *G02B 3/00* (2013.01); *G02B 3/0056* (2013.01);
(Continued)

(58) Field of Classification Search
CPC ...... H04N 5/2254; H04N 1/028; H04N 5/369; H04N 5/359; G02B 27/0905; G02B 3/00;
(Continued)

(56) References Cited

U.S. PATENT DOCUMENTS 5,493,143 A *   2/1996   Hokari ............. H01L 27/14627
                                                            257/432
7,009,652 B1 *  3/2006   Tanida ................ H01L 27/1462
                                                            348/340
(Continued)

FOREIGN PATENT DOCUMENTS

CN    106537890 A    3/2017
EP    1079613 A2    2/2001
(Continued)

OTHER PUBLICATIONS

International Search Report and Written Opinion of PCT Application No. PCT/JP2017/021011, dated Aug. 15, 2017, 11 page of ISRWO.

*Primary Examiner* — Twyler L Haskins
*Assistant Examiner* — Akshay Trehan
(74) *Attorney, Agent, or Firm* — Chip Law Group

(57) ABSTRACT

An imaging device includes a light shield that has light shielding walls and a plurality of light transmissive parts in a plurality of apertures between the light shielding walls and a light-receiving element layer in which a large number of
(Continued)

light-receiving elements that perform photoelectric conversion corresponding to incident light inputted through the light transmissive parts of the light shield are arranged to acquire image information that has passed through optical elements that are different between the adjacent light transmissive parts. Further, the image information that passed through optical elements being different for every one of the light transmissive parts adjacent is acquired, and therefore, the sensor areas of the light receiving element is utilized effectively.

3 Claims, 14 Drawing Sheets

(51) Int. Cl.
| | |
|---|---|
| *H01L 27/146* | (2006.01) |
| *H01L 27/142* | (2014.01) |
| *G02B 3/00* | (2006.01) |
| *G02B 27/09* | (2006.01) |
| *G02B 5/30* | (2006.01) |
| *G02B 5/20* | (2006.01) |
| *H04N 1/028* | (2006.01) |

(52) U.S. Cl.
CPC ............ *G02B 3/0075* (2013.01); *G02B 5/20* (2013.01); *G02B 5/30* (2013.01); *G02B 5/3025* (2013.01); *G02B 27/0905* (2013.01); *G02B 27/0961* (2013.01); *H01L 27/142* (2013.01); *H01L 27/146* (2013.01); *H01L 27/14621* (2013.01); *H01L 27/14623* (2013.01); *H01L 27/14625* (2013.01); *H01L 27/14627* (2013.01); *H01L 27/14629* (2013.01); *H04N 1/028* (2013.01); *H04N 5/369* (2013.01); *H01L 27/14618* (2013.01); *Y02E 10/50* (2013.01)

(58) Field of Classification Search
CPC ...... G02B 3/0056; G02B 3/0075; G02B 5/20; G02B 5/30; G02B 5/3025; G02B 27/0961; H01L 27/142; H01L 27/14621; H01L 27/1463; H01L 27/14623; H01L 27/14625; H01L 27/14627; H01L 27/14629; H01L 27/14618

See application file for complete search history.

(56) References Cited

U.S. PATENT DOCUMENTS

| | | | | |
|---|---|---|---|---|
| 2007/0097512 | A1* | 5/2007 | Toyoda | G02B 7/021 |
| | | | | 359/626 |
| 2011/0134282 | A1* | 6/2011 | Morita | G02B 27/0012 |
| | | | | 348/234 |
| 2013/0038690 | A1* | 2/2013 | Mitchell | H04N 13/211 |
| | | | | 348/46 |
| 2016/0070125 | A1* | 3/2016 | Reich | G01J 5/58 |
| | | | | 348/164 |
| 2017/0214863 | A1* | 7/2017 | Narabu | H04N 5/3696 |

FOREIGN PATENT DOCUMENTS

| | | | | |
|---|---|---|---|---|
| EP | 3171587 | * | 5/2017 | ............ H04N 5/225 |
| EP | 3171587 A1 | | 5/2017 | |
| JP | 07-038075 A | | 2/1995 | |
| JP | 8-102924 | * | 4/1996 | ............... H04N 7/14 |
| JP | 08-102924 A | | 4/1996 | |
| JP | 9-116127 | * | 5/1997 | ............. H01L 27/14 |
| JP | 09-116127 A | | 5/1997 | |
| JP | 2001-061109 A | | 3/2001 | |
| JP | 2001-223846 | * | 8/2001 | ............ H04N 1/028 |
| JP | 2001-223846 A | | 8/2001 | |
| JP | 2006-196634 A | | 7/2006 | |
| JP | 2006196634 | * | 7/2006 | ............. H01L 27/14 |
| JP | 2007-121631 A | | 5/2007 | |
| JP | 2007-158825 | * | 6/2007 | ............ H04N 5/225 |
| JP | 2007-158825 A | | 6/2007 | |
| KR | 10-2017-0032227 A | | 3/2017 | |
| TW | 201605236 A | | 2/2016 | |
| WO | 2016/009707 A1 | | 1/2016 | |

* cited by examiner

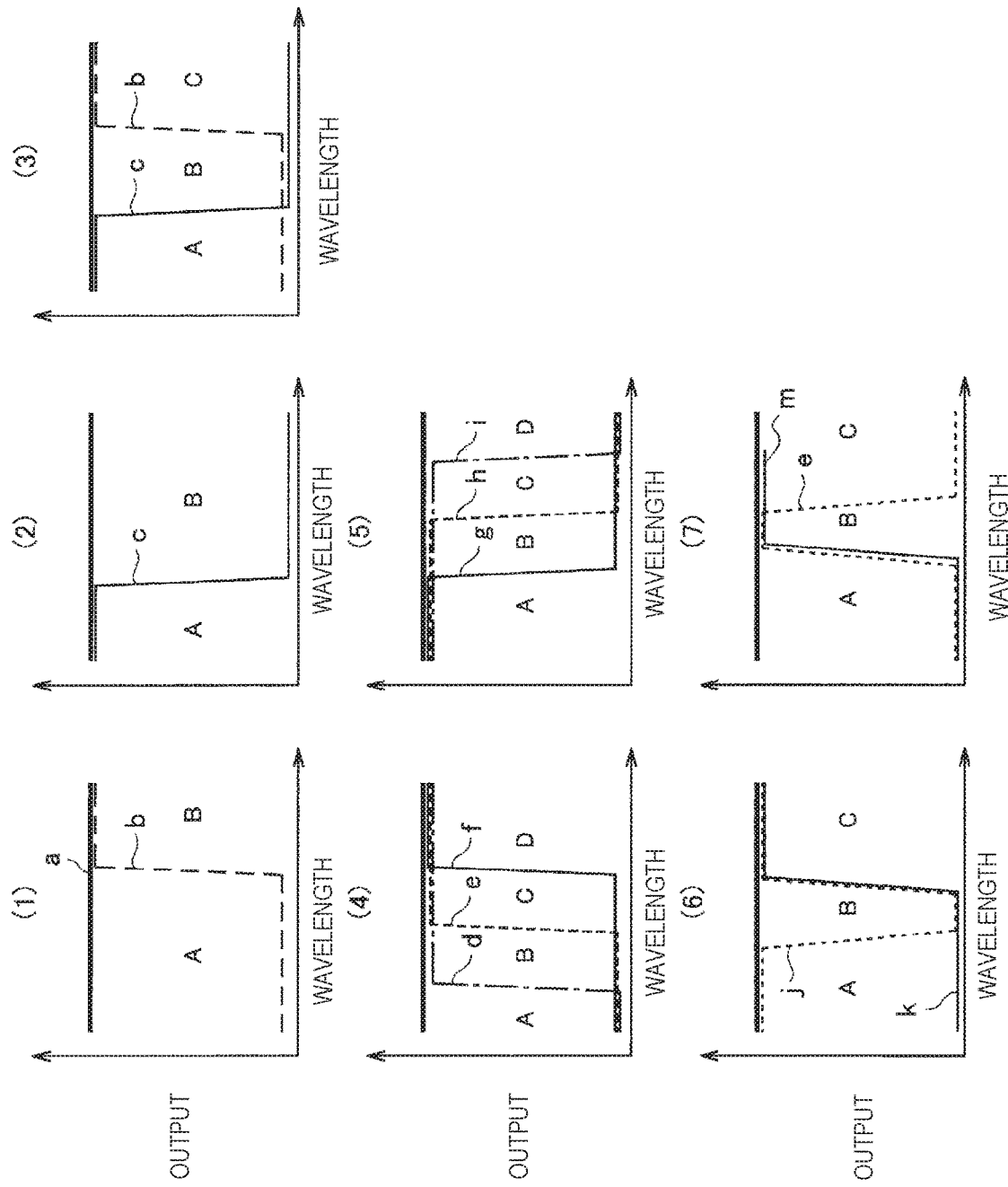

IMAGING DEVICE UTILIZING SENSOR AREA OF PHOTOELECTRIC CONVERSION ELEMENTS CORRESPONDING TO INCIDENT LIGHT PASSED THROUGH OPTICAL ELEMENTS INCLUDING A LAYER OF POLARIZERS OF HORIZONTAL AND VERTICAL DIRECTIONS AND QUARTER WAVE PLATES

CROSS REFERENCE TO RELATED APPLICATIONS

This application is a U.S. National Phase of International Patent Application No. PCT/JP2017/021011 filed on Jun. 6, 2017, which claims priority benefit of Japanese Patent Application No. JP 2016-150039 filed in the Japan Patent Office on Jul. 29, 2016. Each of the above-referenced applications is hereby incorporated herein by reference in its entirety.

TECHNICAL FIELD

The present disclosure relates to an imaging device.

BACKGROUND ART

Up to now, for example, a technology described in Patent Literature 1 indicated below has been publicly known as a configuration that impedes crosstalk at lower sides of lenses in an image sensor. With respect to the image sensor including a photoelectric conversion element constituted by a plurality of light receiving parts and microlenses fabricated respectively corresponding to the plurality of light receiving parts, Patent Literature 1 describes a configuration in which light shields, each limiting a light incident direction for every one of the light receiving sections, are integrally formed at a region sandwiched by the photoelectric conversion element and the microlenses on the photoelectric conversion element.

CITATION LIST

Patent Literature

Patent Literature 1: JP 2001-223846

Non-Patent Literature

DISCLOSURE OF INVENTION

Technical Problem

However, according to the technology disclosed in Patent Literature 1 above-cited, subject areas to be captured by microlenses located adjacent may overlap with each other. Owing to the above, there arises a problem that a sensor area of the photoelectric conversion element cannot be utilized effectively.

Accordingly, the effective utilization of the sensor area of the light-receiving element layer has been demanded so far.

Solution to Problem

According to the present disclosure, there is provided an imaging device including: a light shield that has light shielding walls and a plurality of light transmissive parts formed in a plurality of apertures between the light shielding walls; and a light-receiving element layer in which a large number of light-receiving elements that perform photoelectric conversion corresponding to incident light inputted through the light transmissive parts of the light shield are arranged to acquire a plurality of types of pieces of image information that are different between areas of the adjacent light transmissive parts.

Advantageous Effects of Invention

As described in the foregoing, according to the present disclosure, the effective utilization of the sensor area of the light receiving element has been demanded so far.

Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 19 is a schematic diagram illustrating concrete characteristics of wavelength selection filters.

MODE(S) FOR CARRYING OUT THE INVENTION

Figure 1:
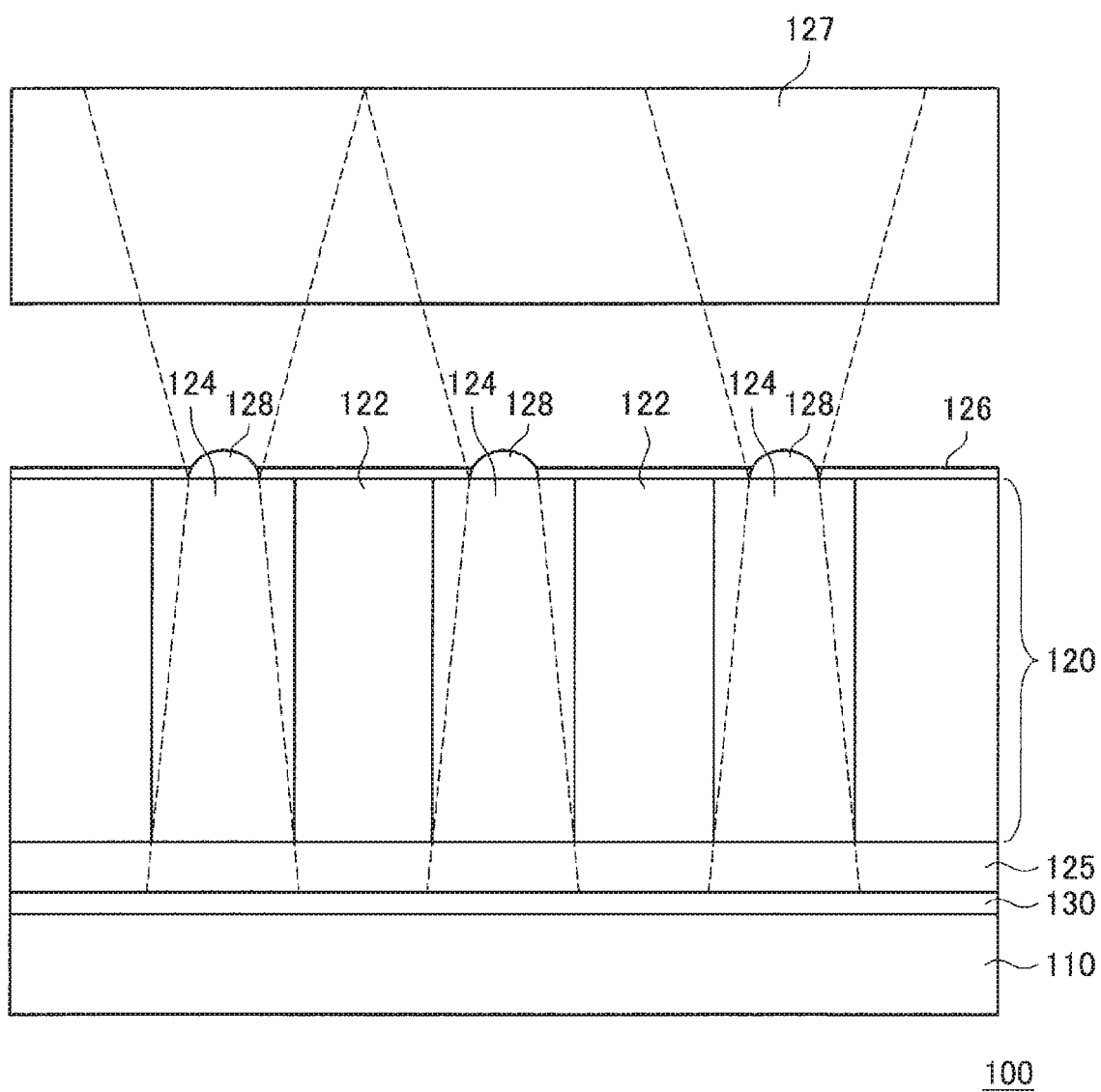
FIG. 1 is a cross-sectional schematic diagram illustrating a configuration serving as a premise of an imaging device in accordance with an embodiment of the present disclosure.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Incidentally, the following explanation will be made according to an order indicated below.

1. Exemplified Configuration serving as Premise
2. Exemplified Configuration of Imaging Device in accordance with Present Disclosure 1. Exemplified Configuration Serving as Premise FIG. 1 is a cross-sectional schematic diagram illustrating a configuration serving as a premise for an imaging device in accordance with an embodiment of the present disclosure. As similar to an imaging device 200 in accordance with a present embodiment detailed later, an imaging device 100 of this type is employed for photographing a biological information such as, e.g., a fingerprint or the like. The imaging device 100 is constituted by having a light-receiving element layer 110, a light shield 120, a thin-film joining resin layer 130, a lower-side light shielding layer 125, an upper-side light shielding layer 126 and a cover glass 127.

The imaging device 100 is formed by joining the light-receiving element layer 110 and the light shield 120 with the thin-film joining resin layer 130 therebetween. By joining the light-receiving element layer 110 and the light shield 120 with the thin-film joining resin layer 130 without forming any gap therebetween, dew condensation to be possibly generated in the gap can be prevented, and thereby, it is possible to suppress deterioration of an acquired image.

The light-receiving element layer 110 includes a large number of light receiving elements arranged lengthwise and breadthwise. The thin-film joining resin layer 130 is made of a transparent material and is disposed to join the light-receiving element layer 110 and the light shield 120 without any gap.

The light shield 120 is constituted by light shielding walls 122 made of a Si or the like and light transmissive parts 124 made of a transparent material, such as a glass, a resin or the like. The light shielding walls 122 are formed by applying a fabrication process, such as a lithography and dry etching, etc., to the light shielding material to open throughholes thereto. The light transmissive parts 124 are formed by filling a transparent material into the gaps (namely, the throughholes) between the light shielding walls 122.

Concretely speaking, the light shield 120 is formed such that apertures surrounded by the light shielding walls 122 serve as the light transmissive parts 124 and transmit the light entering from the upper side (light-incidence plane side) to the lower side (light receiving side).

At the lower side of the light shield 120, the lower-side light shielding layer 125 made of a light shielding material, such as a black color filter (BLK CF), a Ti, a W, etc., is formed, such that rectangular apertures, each of which is narrower than each of the apertures (each of light transmissive parts 124 respectively surrounded by the light shielding walls 122) of the light shield 120, are provided thereon.

On the other hand, at the upper side of the light shield 120, the upper-side light shielding layer 126 made of a light shielding material, such as a black color filter (BLK CF), a Ti, a W, etc., etc., is formed, such that circular apertures, each of which is narrower than each of the apertures (each of light transmissive parts 124 respectively surrounded by the light shielding walls 122) of the light shield 120, are provided thereon. Further, microlenses 128 are fabricated at the circular apertures of the upper-side light shielding layer 126, respectively. Still further, the cover glass is disposed at a position nearer to a subject side than that of the microlenses 128.

Figure 5:
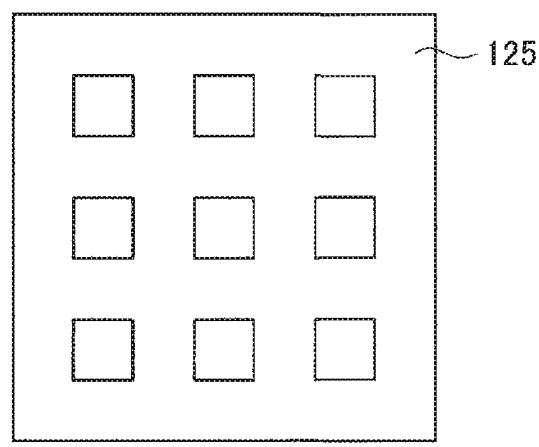
FIG. 5 is a schematic diagram illustrating an arrangement of apertures (rectangular parts) of a lower-side light shielding layer.

The light emitted from the subject passes through the microlenses 128, the upper-side light shielding layer 126, the light transmissive parts 124 and the lower-side light shielding layer 125, and finally enters into the light-receiving element layer 110 as rectangular (square) shaped light corresponding to each of the apertures of the lower-side light shielding layer 125 as illustrated in FIG. 5.

On an occasion of acquiring, for instance, fingerprint information as biological information, a finger of the user is put on the cover glass 127 to illuminate the finger from a side direction with a light emitting diode (LED) or the like. Thereby, the light is diffused within the finger, and by making the internally diffused light enter into the imaging device 100 to capture the image thereof, information in regard to fingerprint, veins, etc. can be acquired.

Figure 2:
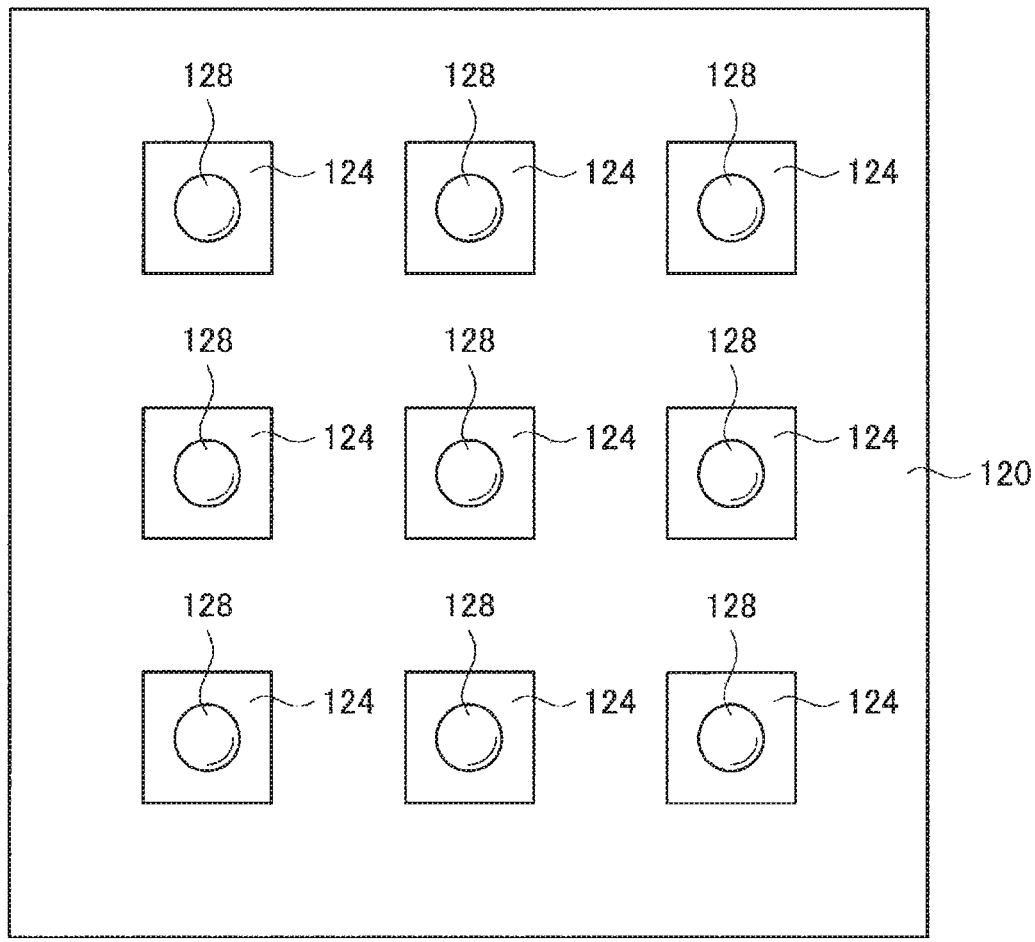
FIG. 2 is a schematic diagram illustrating a state of an imaging device viewed from an upper direction in FIG. 1.
Figure 3:
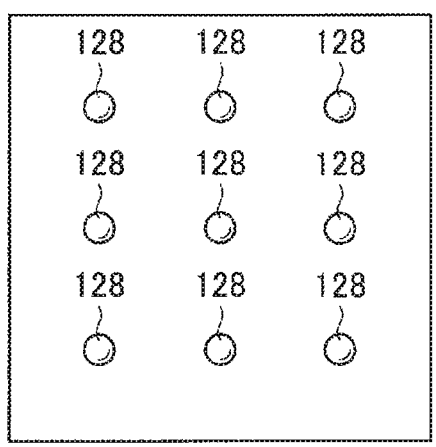
FIG. 3 is a schematic diagram illustrating an arrangement of microlenses.
Figure 4:
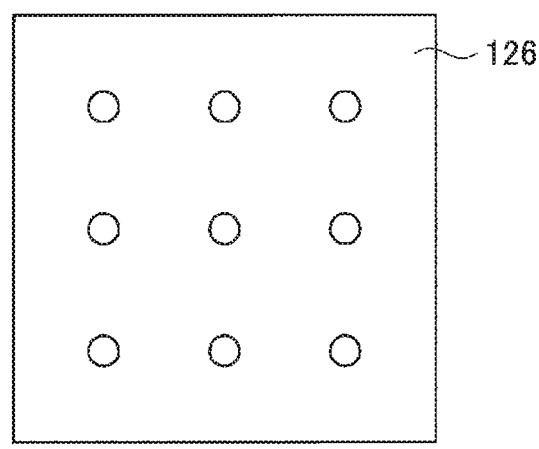
FIG. 4 is a schematic diagram illustrating an arrangement of apertures (circular parts) of an upper-side light shielding layer.

FIG. 2 is a schematic diagram illustrating a state of the imaging device 100 viewed from the upper direction in FIG. 1. In FIG. 2, it is omitted to depict the upper-side light shielding layer 126. Further, FIG. 3 through FIG. 5 are schematic diagrams illustrating the microlenses 128, the upper-side light shielding layer 126 and the lower-side light shielding layer 125, respectively, in a case where the imaging device 200 is viewed from the upper direction in FIG. 2. Herein, FIG. 3 illustrates an arrangement of the microlenses 128, FIG. 4 illustrates an arrangement of the apertures (circular parts) of the upper-side light shielding layer 126 and FIG. 5 illustrates the apertures (rectangular parts) of the lower-side light shielding layer 125.

In the configuration illustrated in FIG. 1 through FIG. 5, within each of the photoelectric conversion areas (pixel area) of the light-receiving element layer 110, a partial region thereof arranged under each of the apertures of the light shield 120 contributes to the photoelectric conversion and is utilized effectively. On the other hand, another partial region of the light-receiving element layer 100 arranged under non-aperture region of the light shield 120 does not contribute the photoelectric conversion and serves as an invalid region due to the shielding of the incoming light. Accordingly, provided that a ratio of an area of the pixel area of the light-receiving element layer 110 versus an area contributing the photoelectric conversion is defined as a sensor area efficiency, the sensor area efficiency decreases in the exemplary configuration illustrated in FIG. 1 through FIG. 5. Owing to this, in order to obtain desired efficiency and function as the imaging device 100, it is necessary to enlarge the sensor area, resulting in a factor of cost increase.

Figure 6:
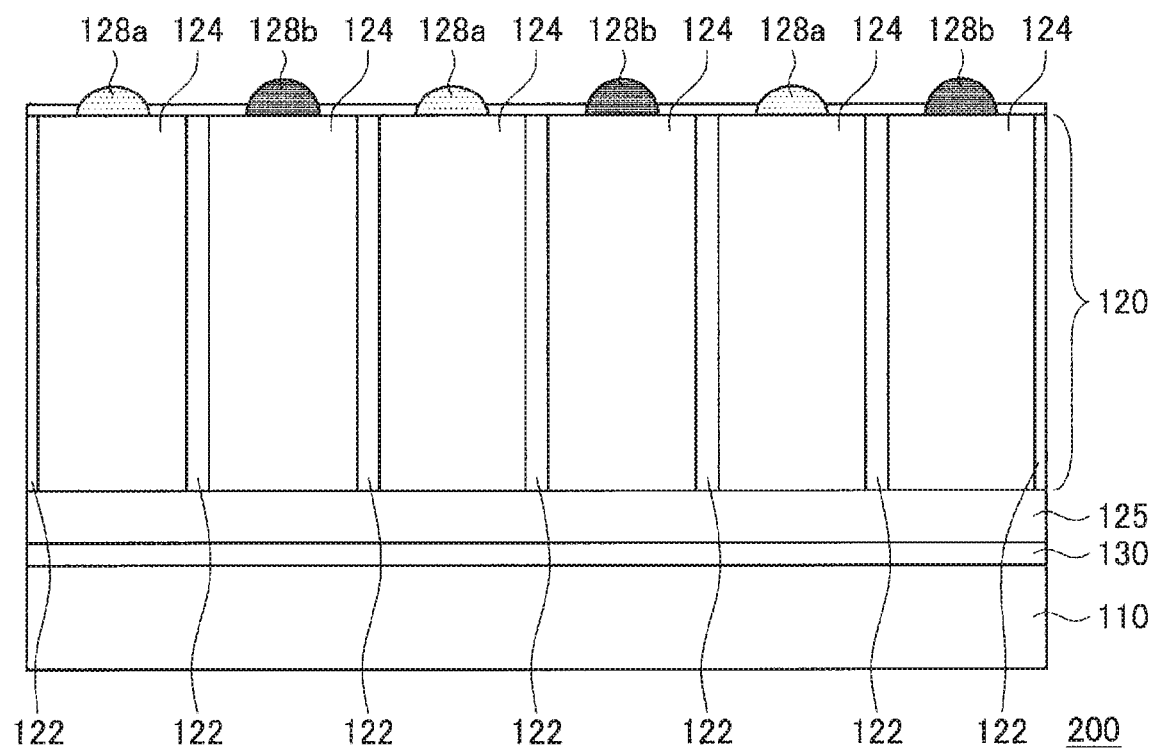
FIG. 6 is a cross-sectional schematic diagram illustrating a configuration of an imaging device in accordance with an embodiment of the present disclosure.
Figure 7:
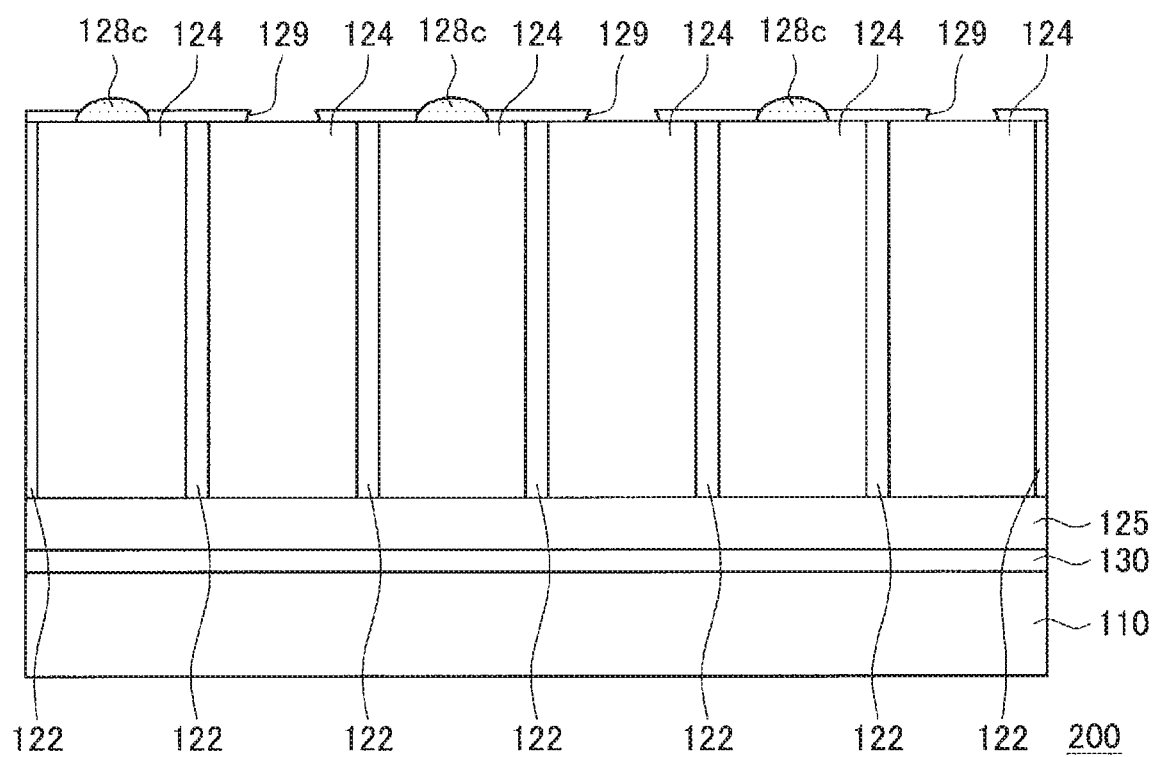
FIG. 7 is a cross-sectional schematic diagram illustrating a configuration of an imaging device in accordance with an embodiment of the present disclosure.
Figure 8:
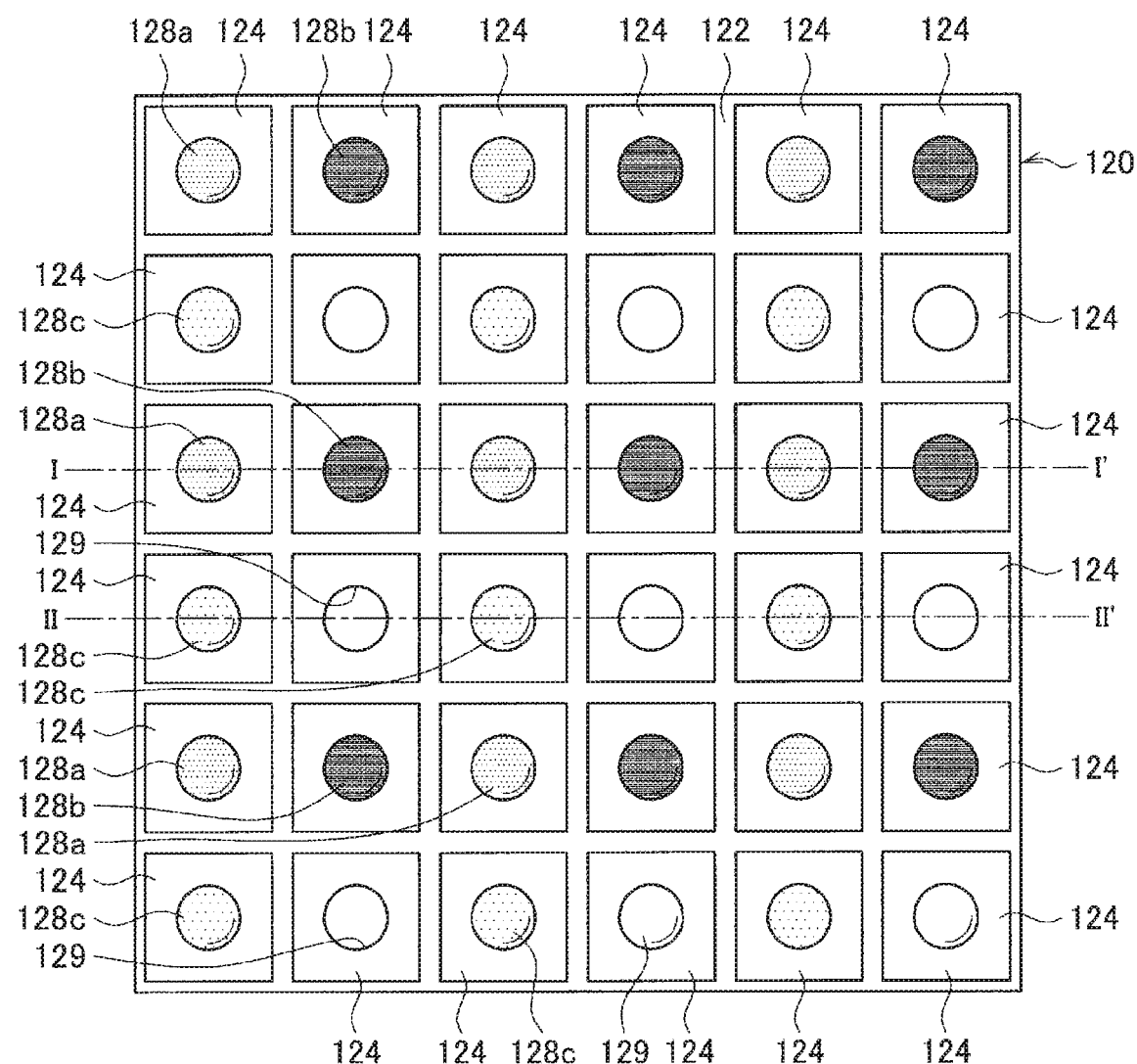
FIG. 8 is a schematic diagram illustrating a state of an imaging device viewed from an upper direction in FIG. 6 and FIG. 7.
Figure 9:
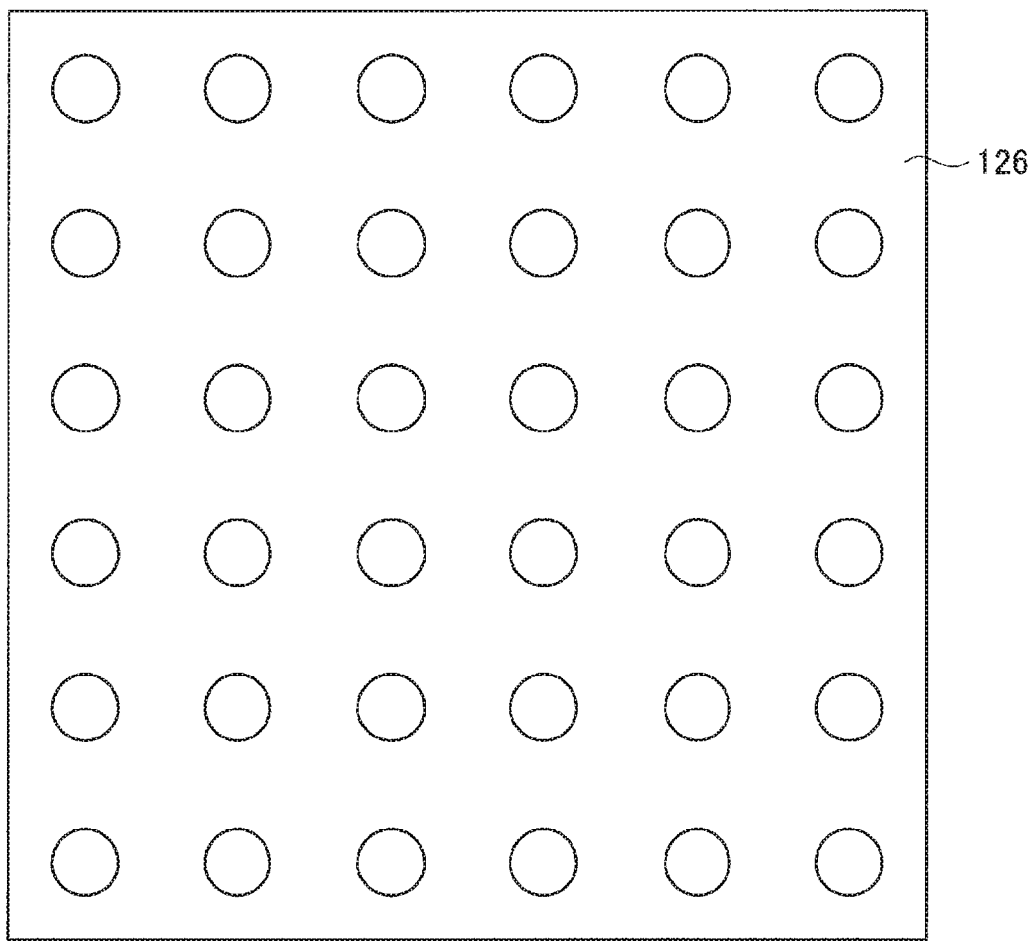
FIG. 9 is a schematic diagram illustrating an arrangement of apertures (circular parts) of an upper-side light shielding layer.
Figure 10:
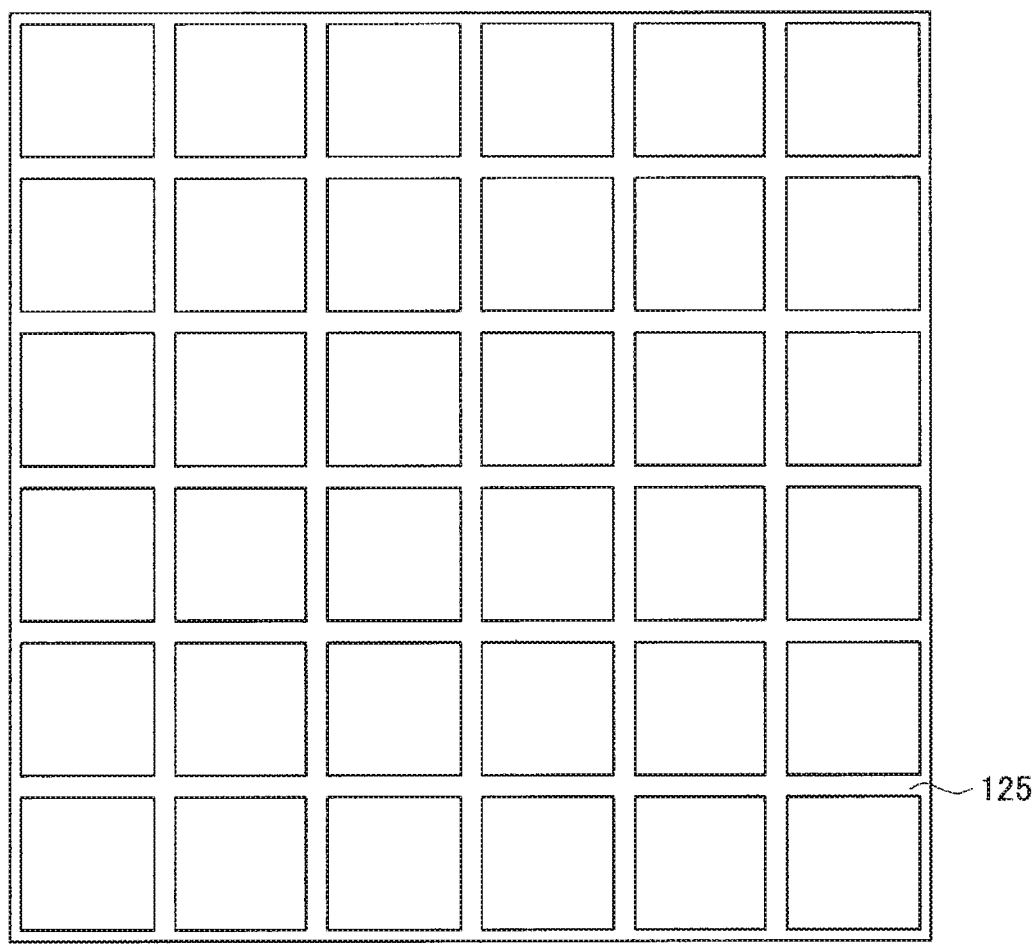
FIG. 10 is a schematic diagram illustrating an arrangement of apertures (rectangular parts) of a lower-side light shielding layer.

2. Exemplified Configuration of Imaging Device in accordance with Present Disclosure In the present embodiment, apertures of the light shield 120 are provided even in the portion, which serves as the non-aperture region of the light shield 120 in the configuration illustrated in FIG. 1 through FIG. 5, to improve the sensor area efficiency. FIG. 6 and FIG. 7 are cross-sectional schematic diagrams illustrating a configuration of the imaging device 200 in accordance with an embodiment of the present disclosure. Further, FIG. 8 is a schematic diagram illustrating a state of the imaging device 100 viewed from the upper direction in FIG. 6 and FIG. 7. In FIG. 8, it is omitted to depict the upper-side light shielding layer 126. Still further, FIG. 9 and FIG. 10 are schematic diagrams illustrating the upper-side light shielding layer 126 and the lower-side light shielding layer 125, respectively, in a case where the imaging device 200 is viewed from the upper direction in FIG. 6 and FIG. 7. Herein, FIG. 8 illustrates arrangements of the microlenses 128 and the light transmissive parts 124, while FIG. 9 illustrates an arrangement of the apertures (circular parts) of the upper-side light shielding layer 126, and FIG. 10 illustrates the apertures (rectangular parts) of the lower-side light shielding layer 125.

Further, FIG. 6 illustrates a cross section along the alternate long and short line I-I' illustrated in FIG. 8, while FIG. 7 illustrates another cross section along the alternate long and short line II-II' illustrated in FIG. 8.

As illustrated in FIG. 6 through FIG. 10, according to the imaging device 200 in accordance with the present embodiment, apertures (light transmissive parts 124) of the light shield 120 are provided even in the area where none of apertures (light transmissive parts 124) is provided in the configuration illustrated in FIG. 1 through FIG. 5. Herein, FIG. 8 through FIG. 10 illustrate the region having the same area as that illustrated in FIG. 2 through FIG. 5. Comparing FIG. 2 with FIG. 8, it is apparent that 9 pieces of the microlens 128 and the light transmissive part 124 are provided in FIG. 2, while in FIG. 8, 36 pieces of the microlens 128 and the light transmissive part 124 are provided within the same area as that in FIG. 2. If the ratio (in a length direction) of aperture versus non-aperture of the light shielding in the configuration illustrated in FIG. 1 through FIG. 5 is 1:1, it becomes possible to heighten the sensor area efficiency of the configuration in accordance with the present embodiment up to nearly four times at maximum. As a result, the cost can be suppressed to ¼, compared to that in a case where the same function is achieved in the configuration illustrated in FIG. 1 through FIG. 5. Incidentally, by further increasing the number of the microlenses 128 and the light transmissive parts 124 in FIG. 2, the sensor area efficiency can be heightened further. In addition, if the sensor area efficiency increases up to around 4 times, the area of the light-receiving element layer 110 can be reduced to around ¼, and thereby, it is also possible to reduce the manufacturing cost significantly.

In the imaging device 200 of the present embodiment illustrated in FIG. 6 through FIG. 10, optical elements, such as lenses, etc., having different functions are alternately disposed to respectively acquire image information different from each other. Concretely speaking, as illustrated in FIG. 6 through FIG. 8, microlenses 128a for green-wavelength use, microlenses 128b for red-wavelength use, microlenses 128c for blue-wavelength use and pinholes 129 are alternately disposed. As illustrated, the microlenses 128a, 128b, 128c, shapes and materials of which are optimized for every wavelength respectively, and the pinholes 129 are alternately disposed. Thereby, although the imaging area at the object side does not change, it becomes possible to drastically increase an amount of information (double in a column of this drawing alone) acquired without influence of crosstalk in a front direction.

On an occasion of acquiring biological information, it is desirable to change the wavelength of the light to be irradiated corresponding to a measuring object. For instance, in a case of measuring a fingerprint or a pulse, the green wavelength (around 570 nm) is employed. While, in a case of measuring a transparency, a pulse or a melanin, the red wavelength (around 660 nm) is employed. Further, in a case of measuring a subcutaneous fat thickness, a vein or a melanin, the near-infrared wavelength (940) is employed. Since a refraction degree of light varies depending on a wavelength thereof, a lens shape of each of the microlenses 128a, 128b, 128c are optimized corresponding to the wavelength. Thereby, incident light can be acquired through the microlenses 128a, 128b, 128c designed in conformity with the respective wavelengths. Consequently, employing the microlenses 128a, 128b, 128c respectively corresponding to the light wavelengths enables the information acquired from the subject to increase significantly. In addition, by making the light enter through the pinholes 129, it becomes possible to directly acquire the luminance information of the subject.

Figure 11:
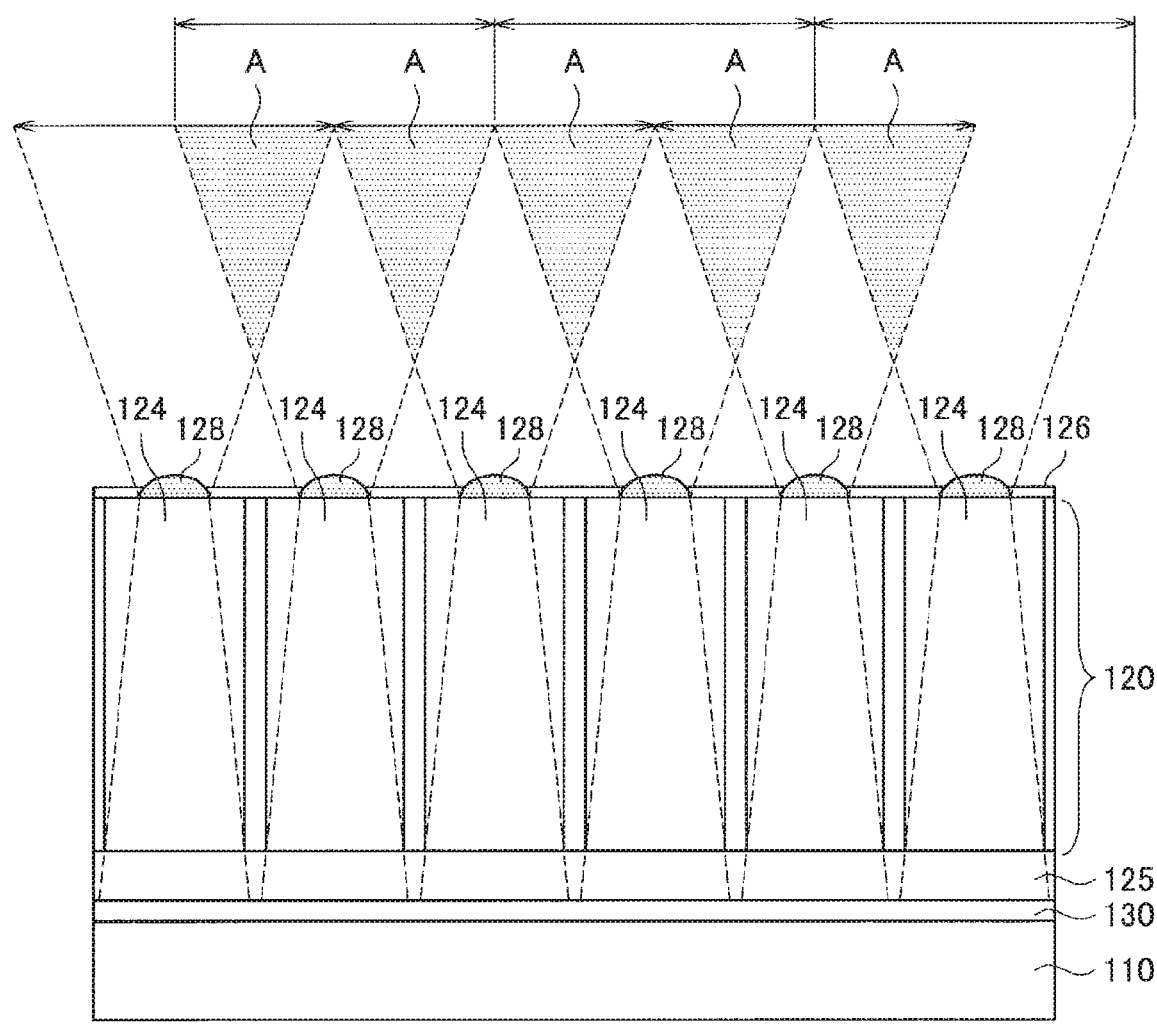
FIG. 11 is a cross-sectional schematic diagram illustrating an example in which arrangement intervals between apertures (light transmissive parts) of a light shield are simply narrowed, compared to those in the configuration illustrated in FIG. 1.

FIG. 11 is a cross-sectional schematic diagram illustrating an example in which arrangement intervals between the apertures (light transmissive parts 124) of the light shield 120, namely, arrangement intervals between the microlenses 128 are simply narrowed compared to those in the configuration illustrated in FIG. 1. In a case where the arrangement intervals between the apertures (light transmissive parts 124) of the light shield 120 are simply narrowed as illustrated in FIG. 11, it appears as if the pixel areas of the light-receiving element layer 110 could be effectively utilized. However, in reality, due to the fact that the image capturing area at the object side does not change, there exhibits no significant change in an amount of information to be obtained by the light-receiving element layer 110. Since the image capturing areas of the microlenses 128 adjacent overlap with each other at each region "A" illustrated in FIG. 11, the same information is excessively acquired, and therefore, narrowing the arrangement intervals of the light transmissive parts 124 does not enable the amount of information to increase. Rather, according to the configuration illustrated in FIG. 11, the crosstalk in a front direction of the lens is generated in the incident light entering into each of the apertures, and thereby, a large amount of load is incurred to signal processing for the obtained information, resulting in a factor of cost increase.

Accordingly, as the exemplary configuration illustrated in FIG. 1 through FIG. 5, the apertures (light transmissive parts 124) of the light shield 120 are disposed at predetermined intervals spacing therebetween, so that the image capturing areas of the microlenses 128 adjacent do not overlap with each other. Owing to the above-mentioned, the light-receiving element layer 100 of a lower layer is not utilized at the region where the aperture of the light shield 120 does not exist, and thereby, the sensor area efficiency decreases.

On the other hand, according to the present embodiment, in the exemplary configuration illustrated in FIG. 1 through FIG. 5, light transmissive parts 124 are newly provided in the peripheral area of the light transmissive parts 124 already existing and the light transmissive parts 124 are made to have different functions respectively. Thereby, the regions of the light-receiving element layer 110 respectively corresponding to the light transmissive parts 124 acquire information different from each other. Accordingly, the region of the light-receiving element layer 110, unused in the exemplary configuration illustrated in FIG. 1 through FIG. 5, can be utilized efficiently, and it is possible to improve the sensor area efficiency significantly.

Figure 12:
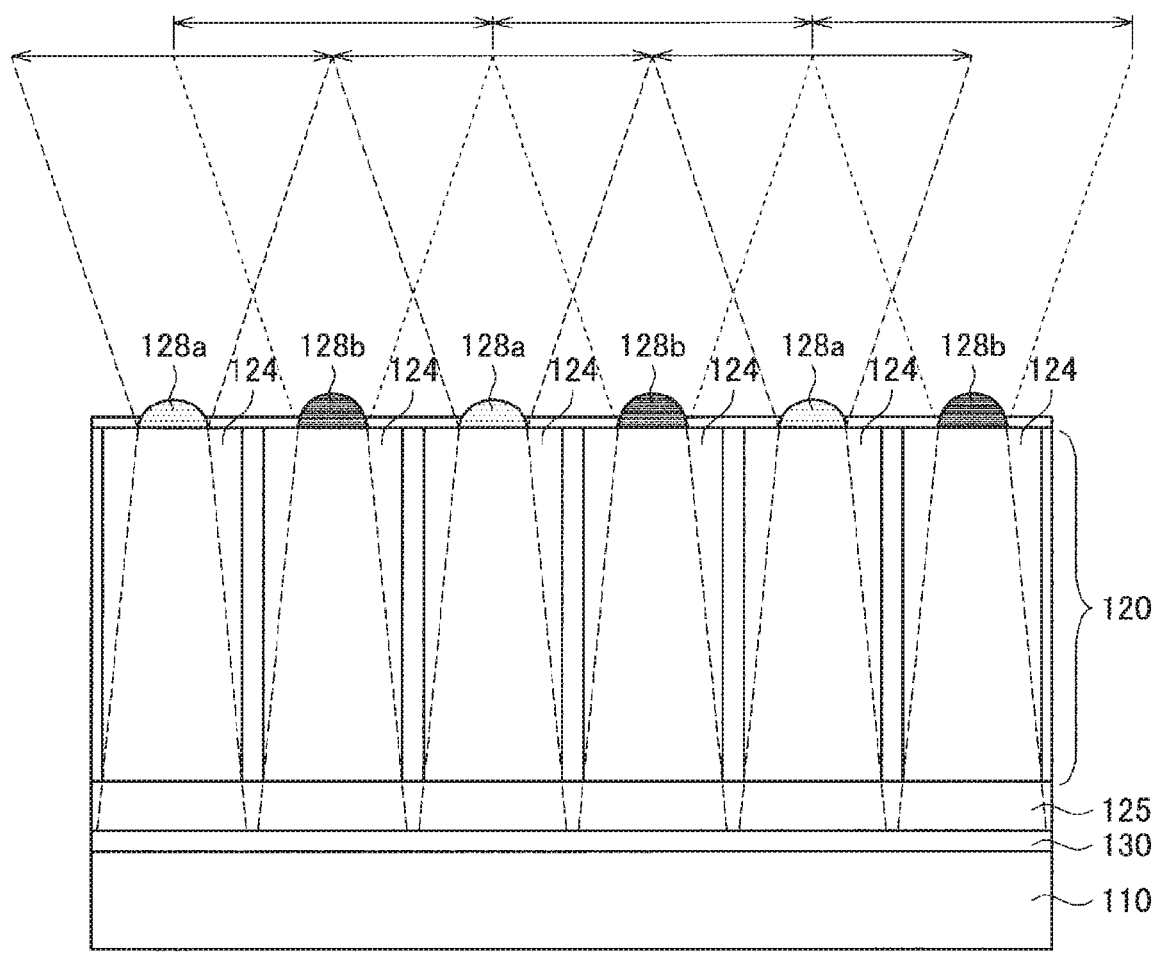
FIG. 12 is a schematic diagram illustrating a situation in which microlenses acquire separate images respectively, in a present embodiment illustrated in FIG. 6.

With respect to the present embodiment illustrated in FIG. 6, FIG. 12 is a schematic diagram illustrating a situation where the microlenses 128a and the microlenses 128b acquire separate images respectively. As illustrated in FIG. 12, the microlenses 128a for the green-wavelength use and the microlenses 128b for the red-wavelength use are alternately disposed, and thereby, the microlenses 128a and the microlenses 128b can acquire separate images respectively. Thanks to the above, it becomes possible not only to increase the information to be obtained, but also to utilize the pixel areas of the light-receiving element layer 110 effectively.

Figure 13:
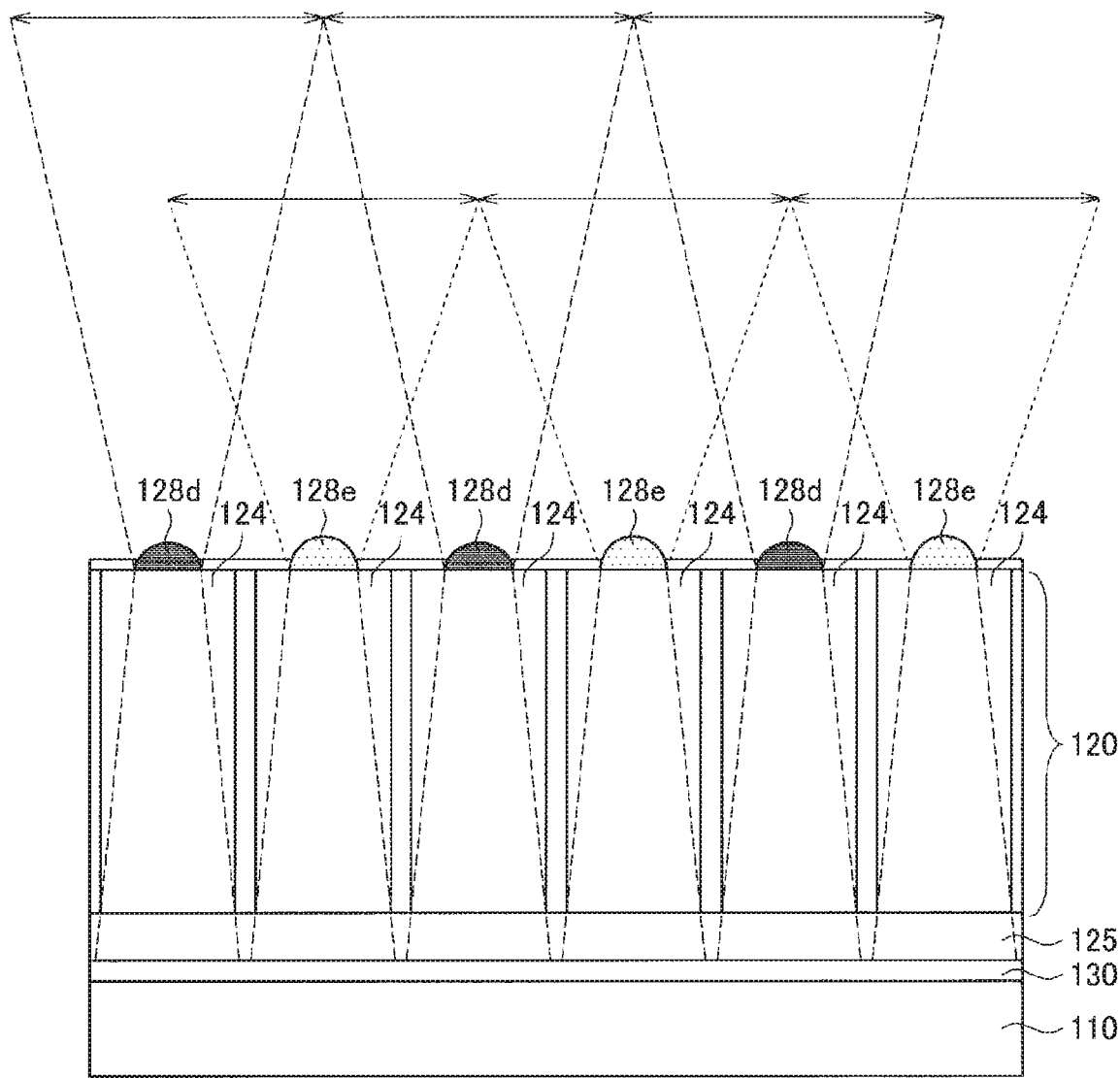
FIG. 13 is a cross-sectional schematic diagram illustrating an example in which microlenses, respectively having different optical magnifications, are alternately disposed.

FIG. 13 is a cross-sectional schematic diagram illustrating an example in which the microlenses 128d and the microlenses 128e, respectively having different optical magnifications, are alternately disposed. The microlenses 128d and the microlenses 128e, respectively having the different optical magnifications, are disposed in a planar staggering pattern. According to the configuration illustrated in FIG. 13, with respect to subjects whose subject distances (focal positions) are different from each other, it is possible to capture images having the same image-capturing area and the same resolution. The exemplary configuration illustrated in FIG. 13 is useful for acquiring a plurality of image information sets different in an object distance (depth). For instance, in a case of acquiring biological information of a finger, a fingerprint and a sweat gland reside on a surface of the finger, while a vein is located at a position being deep with several millimeters from the skin surface. According to the configuration illustrated in FIG. 13, it is possible to acquire these biological information sets, the depths of which are different from each other, at a time. On the other hand, according to the exemplary configuration illustrated in FIG. 1 through FIG. 5, a plurality of the microlenses 128 having an equalized optical magnification is fabricated. Accordingly, in a case, for instance, where the fingerprint of the finger is in focus, the vein becomes out of focus, and thereby, the information of the vein cannot be acquired. As above-described, according to the present embodiment, by making the optical magnifications of the microlenses 128d and the microlenses 128e differ from each other, each of the regions of the light-receiving element layer 110 corresponding to each of the light transmissive parts 124 can acquire different image data, and accordingly, it is possible to improve the sensor area efficiency significantly.

In the example described in the foregoing, by changing characteristics of the microlenses 128, the regions of the light-receiving element layer 110, respectively corresponding to the light transmissive parts 124, are made to acquire image data sets different from each other, respectively. On the other hand, elements may be provided between the microlenses 128 and the light-receiving element layer 110 so that each of the regions of the light-receiving element layer 110 corresponding to each of the light transmissive parts 124 acquires different image data.

Figure 14:
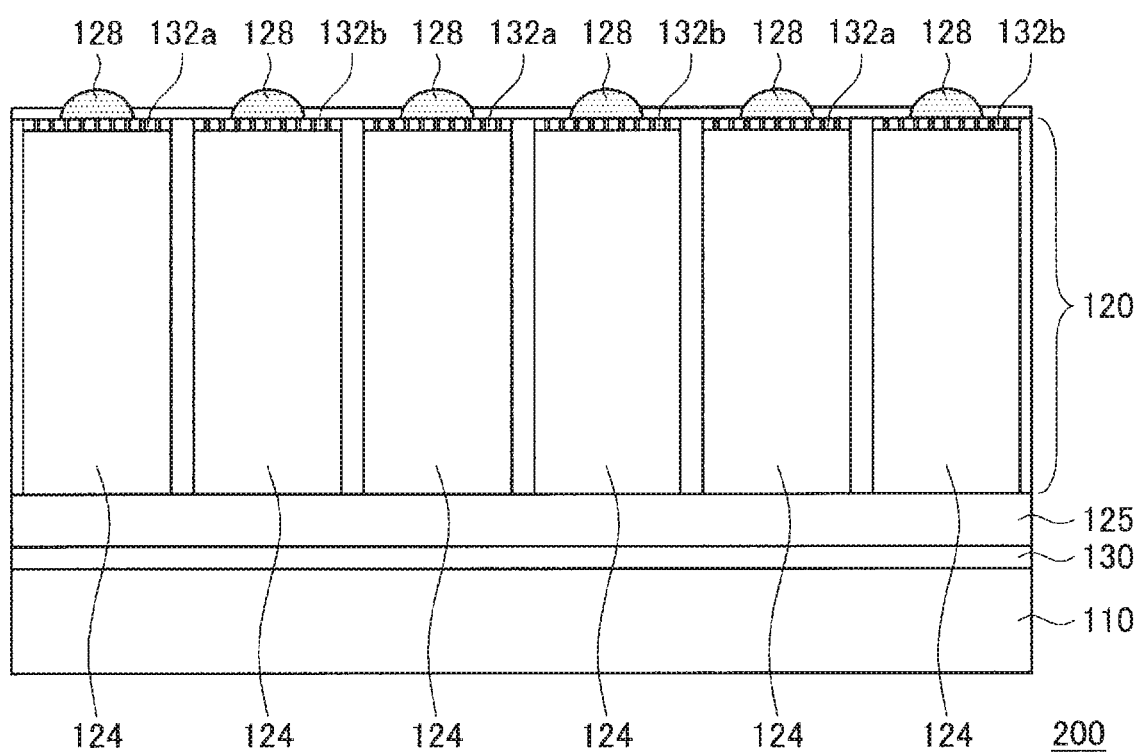
FIG. 14 is a schematic diagram illustrating an example in which different polarizers are added to lower portions of microlenses, respectively.
Figure 15:
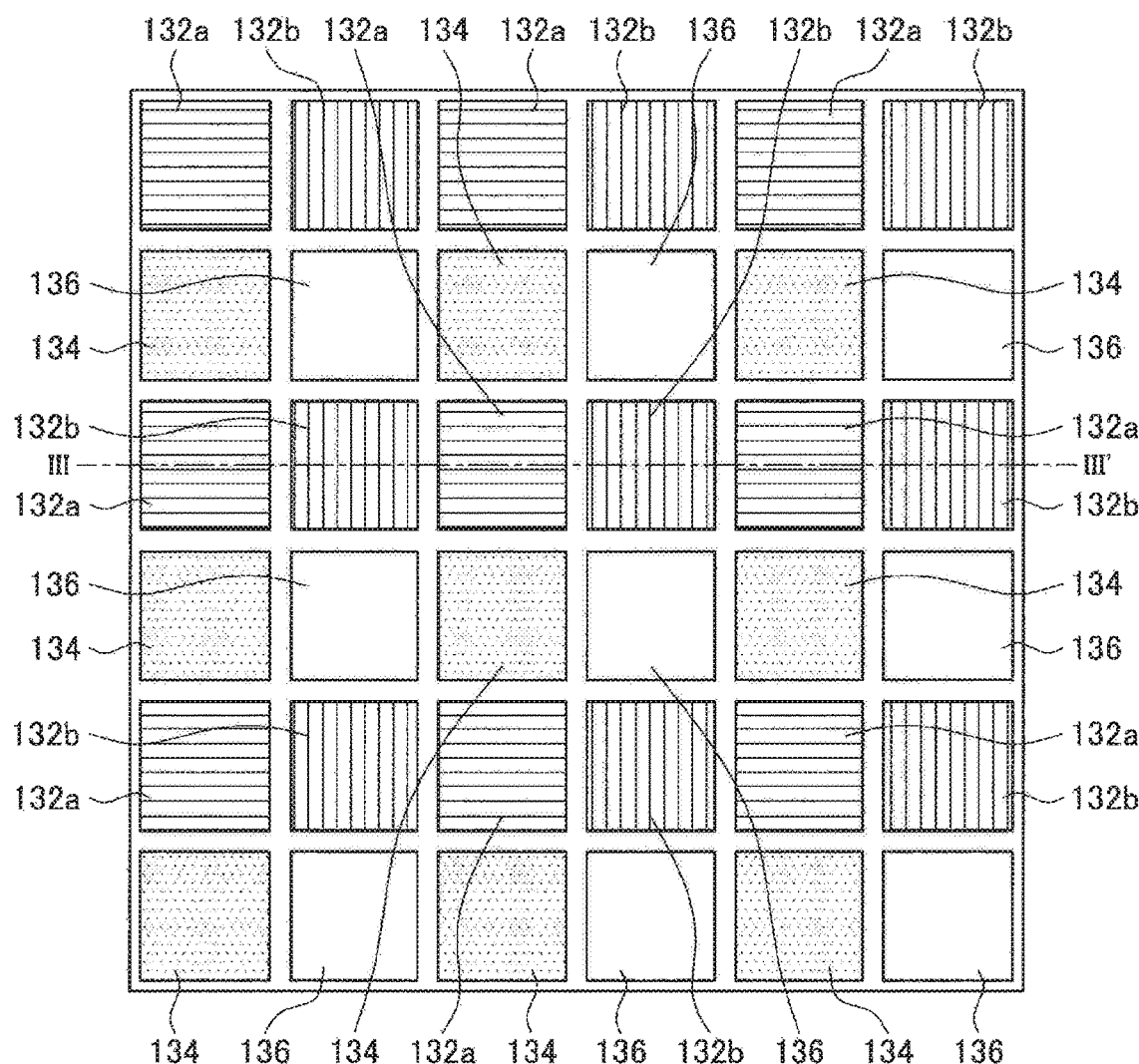
FIG. 15 is a schematic diagram illustrating an example in which different polarizers are added to lower portions of microlenses, respectively.

FIG. 14 and FIG. 15 are schematic diagrams illustrating an example in which polarizers 132a, 132b different from each other are added to the lower portions of the microlenses 128 and the polarizers 132a, 132b are alternately disposed. FIG. 15 is a schematic diagram illustrating a state viewed from an upper direction of FIG. 14, namely, a schematic diagram illustrating an arrangement of the polarizers 132a, 132b. FIG. 14 corresponds to the cross section along the alternate long-and-short dash line illustrated in FIG. 15.

As illustrated in FIG. 15, the polarizers 132a of the horizontal direction and the polarizers 132b of the vertical direction are alternately arranged in the row along the alternate long-and-short dash line and in the other rows located 2 rows above and 2 rows below from that row. The polarizers 132a, 132b are disposed at positions corresponding to the light transmissive parts 124, respectively. Further, λ/4 plates 134 and apertures 136 having no polarizer are alternately arranged in the row along the alternate long-and-short dash line and in the other rows located 1 row upper and 1 row lower from that row. The λ/4 plates 134 and the apertures 136 are also disposed at positions corresponding to the light transmissive parts 124, respectively. Each of the λ/4 plates 134 (quarter wavelength plates) is a kind of the polarizer, having functions for converting incident light into circular polarized light (elliptically polarized light) in a case where the incident light is linearly polarized light, and conversely, converting incident light into linearly polarized light in a case where the incident light is circularly polarized light (elliptically polarized light).

Accordingly, in the regions provided with the polarizers 132a, the polarizers 132b, the λ/4 plates 134, the light-receiving element layer 110 can acquire polarized light corresponding to the polarizers 132a, the polarizers 132b, the λ/4 plates 134. Accordingly, even in the configuration illustrated in FIG. 15, it is possible to make the light transmissive parts 124 adjacent have different functions.

Figure 16:
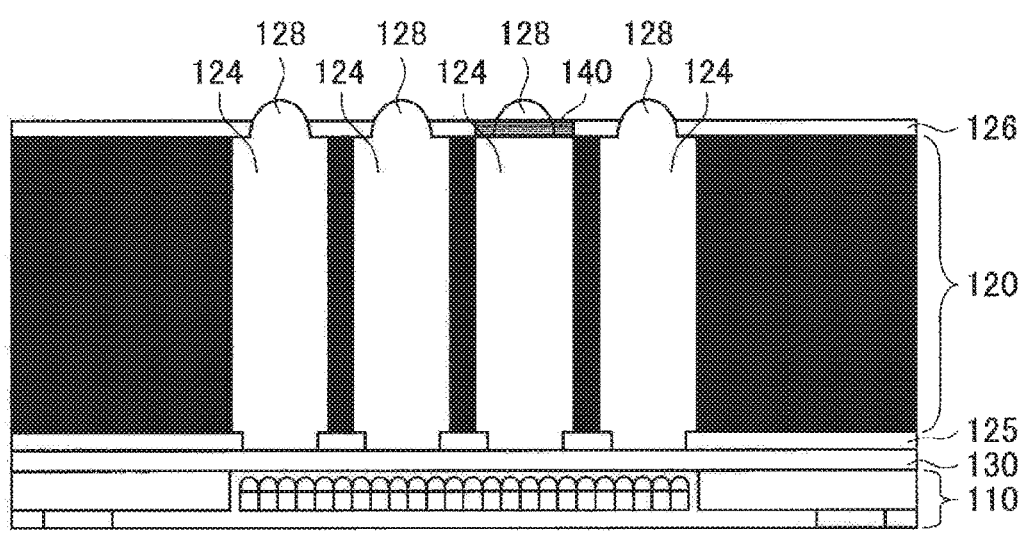
FIG. 16 is a cross-sectional schematic diagram illustrating an example in which a wavelength selection filter is provided under a microlens.
Figure 17:
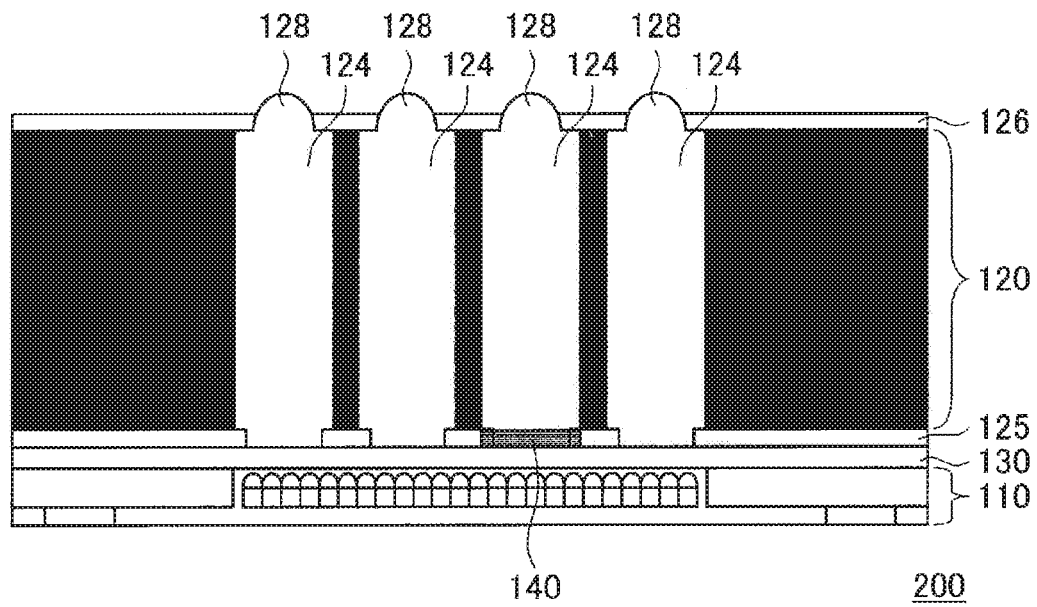
FIG. 17 is a cross-sectional schematic diagram illustrating an example in which a wavelength selection filter is provided at a depth position same as that of a lower-side light shielding layer.
Figure 18:
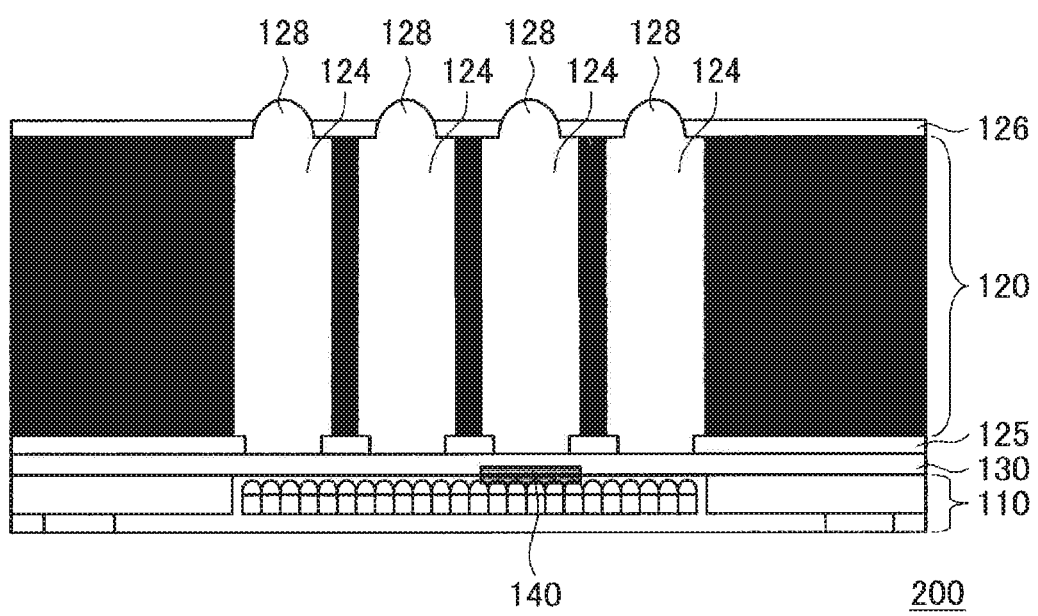
FIG. 18 is a cross-sectional schematic diagram illustrating an example in which a wavelength selection filter is provided upon a light-receiving element layer.

Further, FIG. 16 through FIG. 18 are cross-sectional schematic diagrams illustrating exemplary configurations in which wavelength selection filters 140 are provided corresponding to the light transmissive parts 124, respectively. As an example, each of the wavelength selection filters 140 is made of an organic material including at least one of pigments and dyes, or an inorganic film laminate. Herein, FIG. 16 is a cross-sectional schematic diagram illustrating an example of providing the wavelength selection filter under one of the microlenses 128. Further, FIG. 17 is a cross-sectional schematic diagram illustrating an example of providing the wavelength selection filter 140 at the same depth position as that of the lower-side light shielding layer 125. Still further, FIG. 18 is a cross-sectional schematic diagram illustrating an example of providing the wavelength selection filter on the light-receiving element layer 110. As illustrated in FIG. 16 through FIG. 18, by providing at least one of the wavelength selection filters 140 to a part of the microlenses 128, a plurality of wavelength data sets can be acquired from a plurality of the microlenses 128 at a time.

FIG. 19 is a schematic diagram illustrating concrete characteristics of the wavelength selection filters 140. The wavelength selection filter can be formed by combining a plurality of filter characteristics "a" through "m". Each of characteristics (1) through (7) of the wavelength selection filters 140, illustrated in FIG. 18, represents each of relationships between wavelengths and outputs. In each of characteristics (1) through (7), characteristic "a" represents a relationship between the wavelength and the output in a case of employing none of the wavelength selection filters 140. Further, filter characteristics "b" through "m" are respectively different in the relationship between the wavelength and the output from each other. By combining filter characteristics "a" through "m", each of characteristics (1) through (7) of the wavelength selection filters can be obtained. For instance, in characteristic (3), combining filter characteristic "b" with filter characteristic "c", the wavelength selection filter 140 through which only the wavelengths corresponding to region A and region B passes is formed. Further, in characteristic (4) and characteristic (5), by changing the combinations of filter characteristics "d" through "f" and filter characteristics "g" through "i" respectively as needed, any kind of wavelength selection filter 140 that makes regions A through D from a short wavelength side to a long wavelength side pass through or shut off can be formed. As described above, by disposing the wavelength selection filters 140 having different wavelength selection characteristics onto the light transmissive parts 124 provided with the microlenses 128, it becomes possible to make the light transmissive parts 124 adjacent have different functions, respectively.

As described in the foregoing, in the present embodiment, the image information that passed through optical elements being different for every one of the light transmissive parts 124 adjacent is acquired by the light-receiving element layer 110. Herein, the microlenses 128a through 128f, the pinholes 129, the polarizers 132a, 132b and the wavelength selection filters 140, described in the foregoing, correspond to the optical elements.

Thereby, according to the present embodiment, it becomes possible to obtain a large amount of information more than ever from the regions of the light-receiving element layer 110 respectively corresponding to the light transmissive parts 124. Further, by utmostly reducing non-aperture parts of the light shield 120 disposed below the microlenses 128 to impede the crosstalk, it becomes possible to improve the sensor area efficiency, significantly. Still further, the optical elements having different functions, such as lenses or the like, are alternately disposed for every light transmissive parts 124 adjacent to acquire image information sets being different respectively. Thereby, it becomes possible to drastically increase an amount of information obtained without influence of the crosstalk in front of the lenses.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)
An imaging device including:
a light shield that has light shielding walls and a plurality of light transmissive parts formed in a plurality of apertures between the light shielding walls; and
a light-receiving element layer in which a large number of light-receiving elements that perform photoelectric conversion corresponding to incident light inputted through the light transmissive parts of the light shield are arranged to acquire image information that has passed through optical elements that are different between the adjacent light transmissive parts.

(2)
The imaging device according to (1),
in which the optical elements are microlenses provided at a light incident surface side of the light shield for the respective light transmissive parts, and
the light-receiving element layer is provided with the light-receiving elements that perform the photoelectric conversion corresponding to the incident light converged by the microlenses and inputted through the plurality of light transmissive parts.

(3)
The imaging device according to (2),
in which the microlenses corresponding to the adjacent light transmissive parts have different shapes corresponding to wavelengths of the incident light.

(4)
The imaging device according to (2),
in which the microlenses corresponding to the adjacent light transmissive parts have different optical magnifications corresponding to subject distances.

(5)
The imaging device according to (2),
in which as the optical element, a pinhole instead of the microlens is provided at one of the adjacent light transmissive parts.

(6)
The imaging device according to (1),
in which the optical elements are wavelength conversion filters that are provided at the adjacent light transmissive parts and that converts a wavelength such that the wavelength of the incident light differs for the respective adjacent light transmissive parts.

(7)
The imaging device according to (6), including:
a first light shielding layer that is formed at a light incident surface side of the light shield and that has apertures for the respective apertures of the light shield,
in which the wavelength conversion filters are provided in a vicinity of the first light shielding layer.

(8)
The imaging device according to (6), including:
a second light shielding layer that is formed at the light-receiving element layer side of the light shield and that has apertures for the respective apertures of the light shield,
in which the wavelength conversion filters are provided in a vicinity of the second light shielding layer.

(9)
The imaging device according to (6),
in which the wavelength conversion filters are provided on a surface of the light-receiving element layer.

(10)
The imaging device according to (1),
in which the optical elements are polarizers that are provided at the adjacent light transmissive parts to control a polarizing direction such that the polarizing direction of the incident light differs for the respective adjacent light transmissive parts.

(11)
The imaging device according to (10), including:
a first light shielding layer that is formed at a light incident surface side of the light shield and that has apertures for the respective apertures of the light shield,
in which the polarizers are provided in a vicinity of the first light shielding layer.

REFERENCE SIGNS LIST 110 light-receiving element layer
120 light shield
122 light shielding walls
128, 128a through 128e microlenses
129 pinholes
132a, 132b polarizers
140 wavelength selection filters
200 imaging device

The invention claimed is:

1. An imaging device, comprising:
    a light shield that includes:
        a plurality of light shielding walls,
        a plurality of light transmissive parts in a plurality of first apertures between the plurality of light shielding walls; and
    a light-receiving element layer that includes light-receiving elements, wherein
        the light-receiving elements are configured to
            perform photoelectric conversion corresponding to incident light inputted through the plurality of light transmissive parts of the light shield; and
            acquire image information corresponding to the incident light passed through optical elements,
        the optical elements include polarizers of a horizontal direction, polarizers of a vertical direction, and quarter wave plates,
        a first row of light transmissive parts of the plurality of light transmissive parts alternately include a polarizer of the polarizers of the horizontal direction and a polarizer of the polarizers of the vertical direction, and
        alternate light transmissive part of a second row of light transmissive parts, adjacent to the first row of light transmissive parts, of the plurality of light transmissive parts includes a quarter wave plate of the quarter wave plates.

2. The imaging device according to claim 1, wherein the optical elements control a polarizing direction such that the polarizing direction of the incident light differs for the respective adjacent light transmissive parts of the plurality of light transmissive parts.

3. The imaging device according to claim 2, comprising:
    a first light shielding layer at a light incident surface side of the light shield, wherein
        the first light shielding layer has a plurality of second apertures for the respective apertures of the plurality of first apertures of the light shield, and
        the optical elements in a vicinity of the first light shielding layer.

* * * * *